(12) United States Patent  
Schwerin

(10) Patent No.: US 7,445,985 B2  
(45) Date of Patent: Nov. 4, 2008

(54) DRAM MEMORY AND METHOD FOR FABRICATING A DRAM MEMORY CELL

(75) Inventor: Ulrike Gruning-Von Schwerin, Munich (DE)

(73) Assignee: Infineon Technologies AG, Munich (DE)

(*) Notice: Subject to any disclaimer, the term of this patent is extended or adjusted under 35 U.S.C. 154(b) by 392 days.

(21) Appl. No.: 11/055,755

(22) Filed: Feb. 10, 2005

(65) Prior Publication Data  
US 2005/0196918 A1 Sep. 8, 2005

(30) Foreign Application Priority Data  
Feb. 10, 2004 (DE) .................. 10 2004 006 520

(51) Int. Cl.  
*H01L 21/8242* (2006.01)

(52) U.S. Cl. ............ 438/242; 438/243; 257/E21.646

(58) Field of Classification Search ......... 438/241–242, 438/243–244, 386; 257/E21.646  
See application file for complete search history.

(56) References Cited  
U.S. PATENT DOCUMENTS  
2006/0056228 A1* 3/2006 Schloesser et al. .......... 365/149

* cited by examiner

*Primary Examiner*—Thanhha Pham  
(74) *Attorney, Agent, or Firm*—Dicke, Billig & Czaja, PLLC

(57) ABSTRACT

A DRAM memory cell arrangement having memory cells each having a trench capacitor and a fin field-effect transistor or FinFET for addressing the trench capacitor. The memory cells are arranged in cell rows which are offset with respect to one another and are separated from one another by trench insulator structures. Word lines orthogonal to the cell rows mesh in comblike fashion between the cell rows and alternately traverse trench capacitors and channel regions of fin field-effect transistors. By means of a on-photolithographic mask having mask sections aligned with the trench capacitors, trench-insulator structures are provided in each case between a sidewall gate section of a word line and the adjoining trench capacitor, said trench-insulator structures decoupling the respective trench capacitor from the traversing word line.

21 Claims, 13 Drawing Sheets

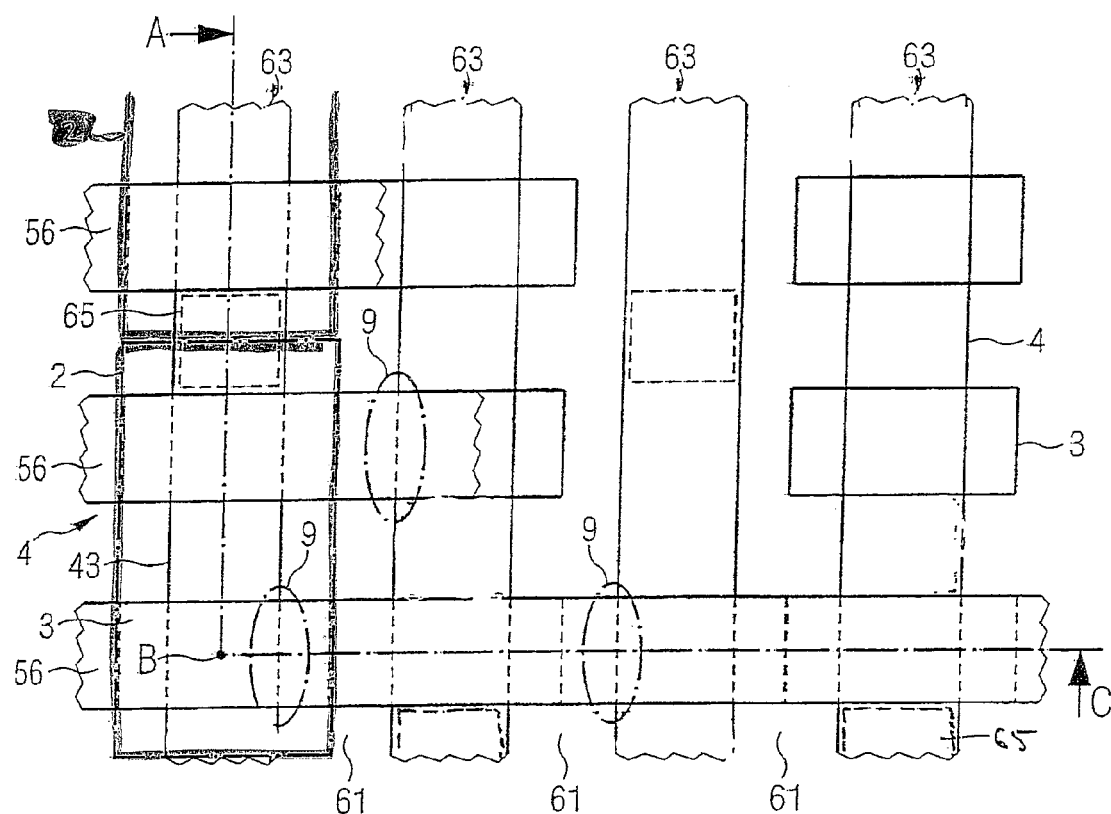

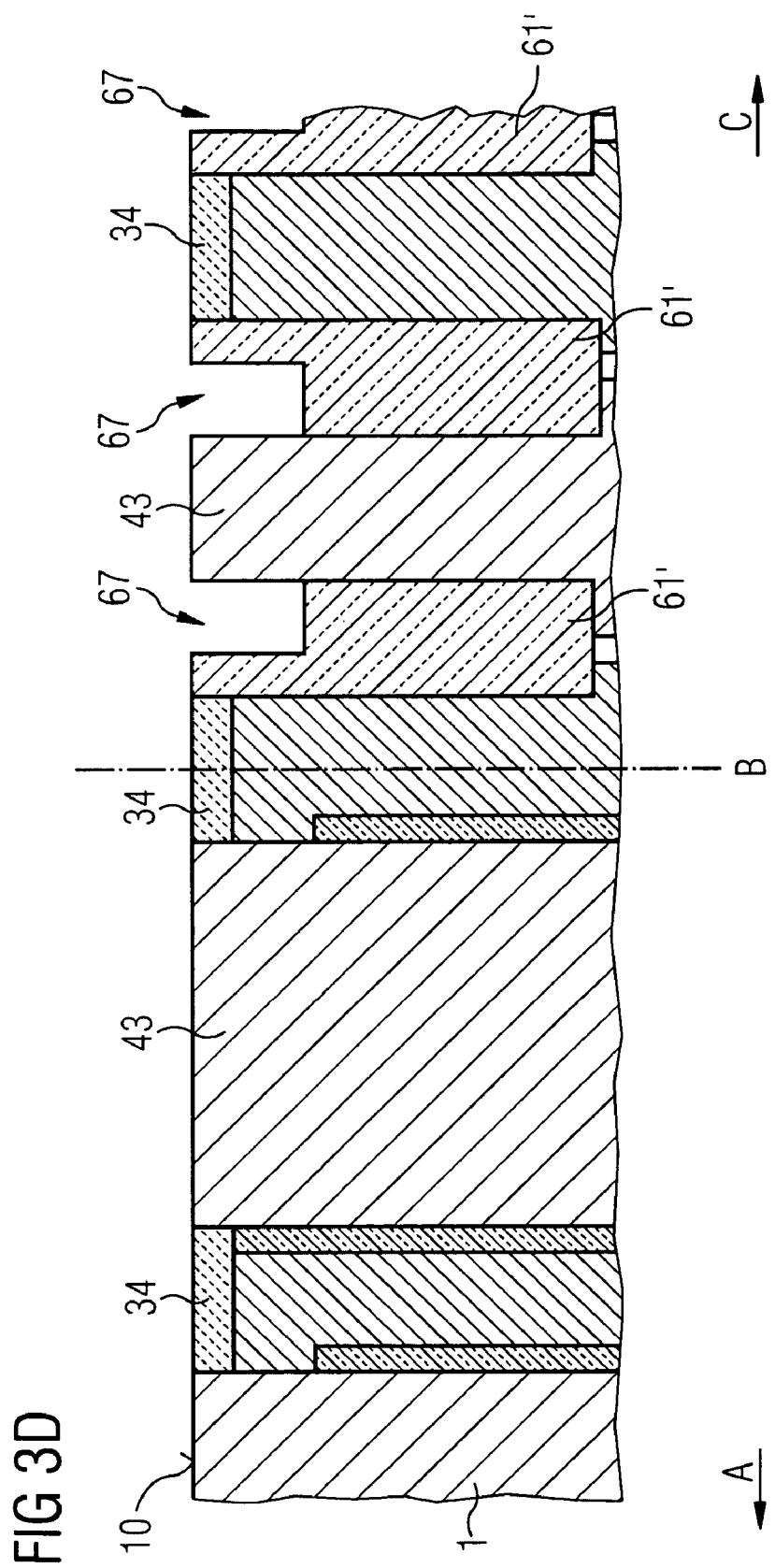

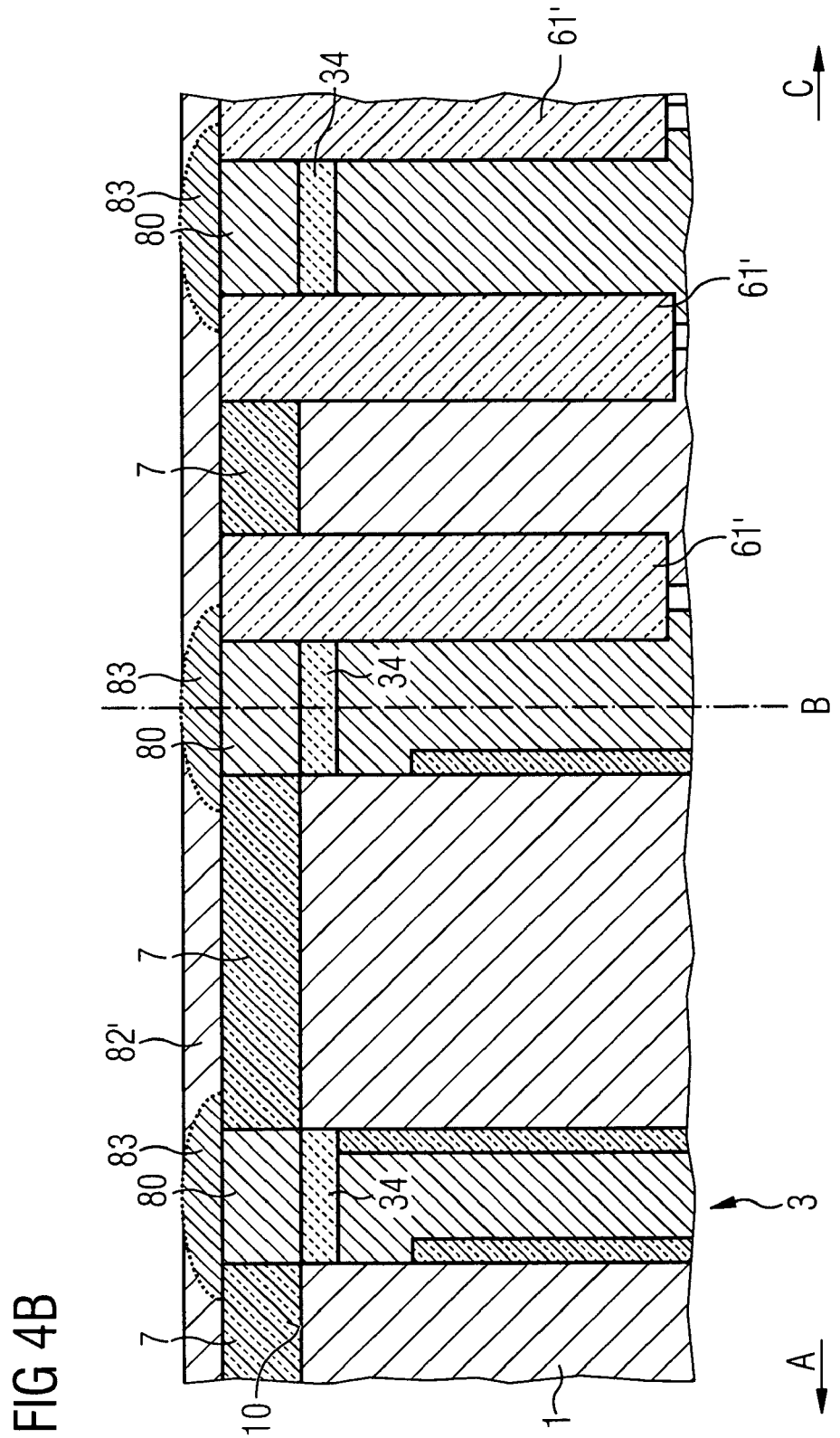

DRAM MEMORY AND METHOD FOR FABRICATING A DRAM MEMORY CELL

CROSS-REFERENCE TO RELATED APPLICATIONS

This Utility Patent Application claims priority to German Patent Application No. DE 10 2004 006 520.9, filed on Feb. 10, 2004, which is incorporated herein by reference.

FIELD OF THE INVENTION

The invention relates to a method for fabricating a DRAM memory cell arrangement having hole trench capacitors and fin field-effect transistors, and to a DRAM memory cell arrangement having hole trench capacitors and fin field-effect transistors.

BACKGROUND

Fin field-effect transistors (also called FinFETs hereinafter) are known as an alternative to customary field-effect transistor structures oriented in planar fashion in a semiconductor substrate with channel lengths of less than 100 nm. In the course of forming a FinFET, gate trenches are introduced into the semiconductor substrate in a recess step. In this case, a semiconductor fin is shaped from the material of the semiconductor substrate between two gate trenches in each case. Buried sections of a gate electrode (buried gate) are introduced into the gate trenches on both sides of the semiconductor fin. The buried sections of the gate electrode extend along the vertical sidewalls of the semiconductor fin. Besides the buried sections, the gate electrode comprises a section bearing on the semiconductor fin (top gate). The section of the semiconductor fin which is enclosed by the gate electrode on three sides corresponds to the channel region of the FinFET, at the first end of which a first source/drain region and at the second end of which a second source/drain region are formed in each case as a doped zone in the semiconductor substrate.

Depending on a gate voltage present at the gate electrode, a conductive channel is formed in the channel region between the two source/drain regions in the on state of the FinFET. In the case of the dimensions that are usually provided for FinFETs, the majority carries are virtually completely removed from the channel region even at comparatively low gate voltages. This means that, in the off state of the fin field-effect transistor, a parasitic charge carrier flow between the source/drain regions and thus a leakage current through the channel region are reduced. The channel width of the FinFET is determined by the depth of the gate trenches and is decoupled from the planar dimensions of the FinFET.

A method for fabricating fin field-effect transistors for DRAM memory cell arrangements is revealed in the publication "Fabrication of Body-Tied FinFETs (omega MOSFETs) using Bulk Si Wafers"; Park et al.; in "2003 on VLSI Technology Digest of Technical Papers".

A description is given below of a DRAM memory cell arrangement such as results from applying the method for fabricating FinFETs that is described therein to a DRAM memory cell arrangement having memory cells each having a trench capacitor for storing electrical charge and a FinFET as selection transistor for addressing the storage capacitor.

The trench capacitors and selection transistors of the memory cells are usually arranged either in chequered fashion in the manner of a "checkerboard layout" or in accordance with an "MINT layout" with—within the cell row—cell pairs of memory cells situated opposite one another in mirror-inverted fashion.

FIG. 1a and FIG. 1b show the resulting memory cell arrangements in accordance with a "checkerboard layout" and an MINT layout, respectively, in each case in a diagrammatic plan view, the illustration of overlying structures being dispensed with in part for the sake of better clarity.

A plurality of DRAM memory cells 2 are in each case arranged to form cell rows 63. A DRAM memory cell 2 in each case comprises a trench capacitor 3 and a FinFET 4 as selection transistor. An active zone 4' of the FinFET 4 is formed in a semiconductor substrate and adjoins the respectively assigned trench capacitor 3 along a cell row 63.

The memory cells 2 are arranged in a manner offset with respect to one another in cell rows 63 that are respectively adjacent to one another. In the checkerboard layout of FIG. 1a, the offset between two adjacent cell rows 63 amounts to half the cell length of the memory cells 2 along the cell row. In the MINT layout in accordance with FIG. 1b, the memory cells 2 are arranged to form cell pairs within the cell rows 63, one of the two memory cells 2 in each case being rotated through 180° with respect to the other memory cell 2, so that the two memory cells 2 of the cell pair are situated symmetrically opposite one another within the cell row. The offset between two adjacent cell rows 63 in each case amounts to half the cell length of the memory cell 2 along the cell row 63.

The semiconductor substrate 1 is caused to recede between the cell rows 63, so that the memory cells 2 of respectively adjacent cell rows 63 are separated from one another by isolation trenches 61. Addressing lines 56 (also called word lines hereinafter) are provided in a direction perpendicular to the cell row 63. Each word line 56 is alternately led in sections as so-called passive word line over trench capacitors 3 and as active word line over the active zones 4' formed in semiconductor fins 43. In the region of the isolation trenches 61, buried sections of the word line 56 mesh in comblike fashion between the cell rows 63. The overlying and buried sections of the word line 56 enclose a channel region within the active zone 4' of the FinFET 4 on three sides. The two source/drain regions of the FinFET 4 are formed on both sides of the word line 56 in a manner adjoining the channel region within the semiconductor fin 43 as part of the active zone 4'. In this case, a first source/drain region adjoins a storage electrode of the trench capacitor 3 and a second source/drain region adjoins a bit line contact region 65 of the active zone 4'. Via the bit line contact region 65, the memory cell 2 is connected to a data or bit line that is to be provided above the word lines 56.

In the memory cell arrangement in accordance with FIG. 1b, the bit line contact region 65 is in each case jointly assigned to a cell pair of memory cells 2 formed symmetrically with respect to one another within the same cell row 63. The word line 56 is in each case alternately led in sections as passive word line over trench capacitors 3 and as active word line over the channel regions of the active zones 4'.

The word lines 56 are provided, by way of example, by a procedure in which, after the introduction of the isolation trenches 61, a conductive material is applied over the whole area and is patterned in a photolithographic method by means of a strip mask.

The word lines 56 meshing between the cell rows 63 in comblike fashion from above alternately enclose in each case a semiconductor fin 43 and an upper section of a trench capacitor 3 from three sides. A thin gate dielectric is provided between the semiconductor fin 43 and the word line 56.

If an insulator structure is provided between the word line 56 and the trench capacitor 3 in the same way as the gate dielectric, then this leads either to high parasitic coupling capacitances between the word line 56 and the trench capacitor 3 enclosed by the word line 56 or to reliability problems in the gate dielectric.

The document "Fin-Array-FET on bulk silicon for sub-100 nm Trench Capacitor DRAM"; Katsumata et al.; in "2003 Symposium on VLSI Technology Digest of Technical Papers" describes a method according to which firstly the isolation trenches are introduced into the semiconductor substrate and only afterward are the trench capacitors formed. This ensures that the storage electrode respectively arranged in the interior of a trench capacitor is insulated from the word line by means of a collar insulator structure that is to be provided in a customary manner. It is disadvantageous that the method requires a processing that deviates significantly from the customary process implementation for trench capacitors, for instance since the introduction of the hole trenches or the formation of the trench capacitors is not based on a homogenous semiconductor substrate.

SUMMARY

The invention relates to a method for fabricating a DRAM memory cell arrangement having hole trench capacitors and fin field-effect transistors, and to a DRAM memory cell arrangement having hole trench capacitors and fin field-effect transistors.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A and 1B illustrate plan views of two memory cell arrays in the checkerboard and MINT layouts.

FIGS. 3A-3E illustrate combined longitudinal/cross sections through a memory cell array having trench capacitors and fin field-effect transistors in four phases of a first exemplary embodiment of the method according to the invention with a mask grown in a material-selective manner.

FIGS. 4A-4C illustrate combined longitudinal/cross sections through a memory cell array having trench capacitors and fin field-effect transistors in three different phases of a second exemplary embodiment of the method according to the invention with local variation of the etching resistance of a mask auxiliary layer.

DETAILED DESCRIPTION

Figure 1A:
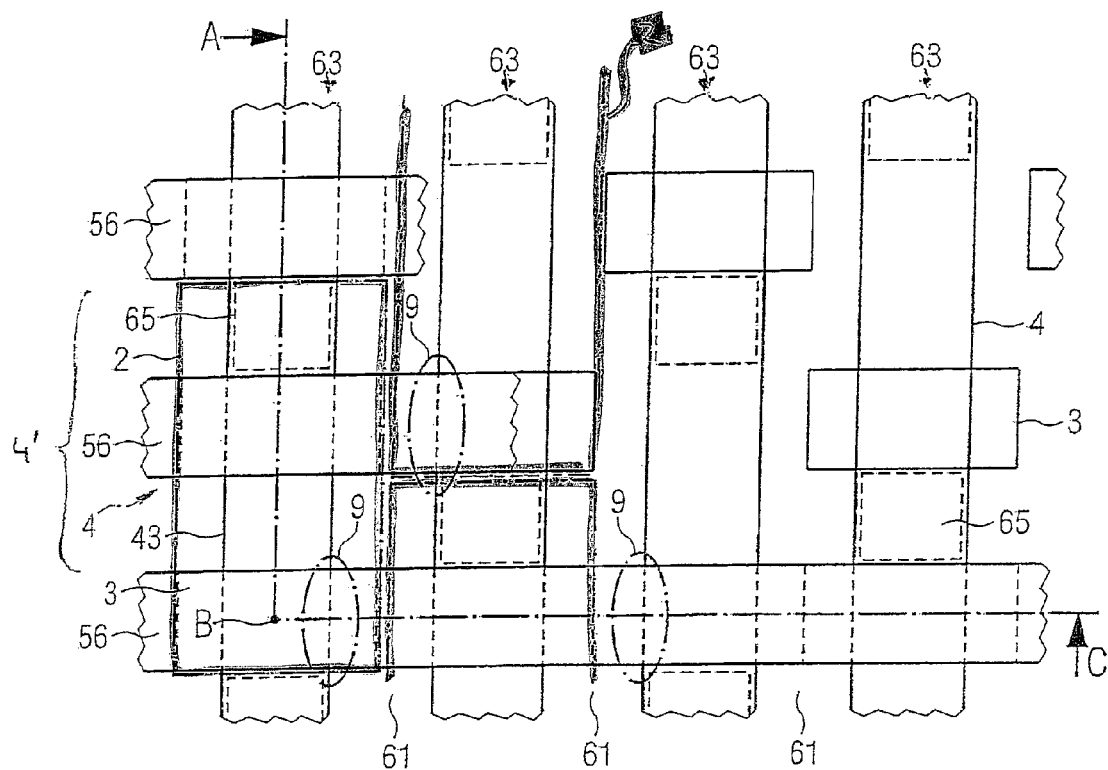

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a method for fabricating a DRAM memory cell arrangement having trench capacitors and fin field-effect transistors which, without changing the processing of the trench capacitors relative to conventional methods, enables an improved decoupling of the word line and the trench capacitors traversed by the word line. The invention encompasses a DRAM memory cell arrangement in which the word lines are sufficiently decoupled from the traversed trench capacitors.

In accordance with a method according to one embodiment of the invention, in order to fabricate a DRAM memory cell arrangement having hole trench capacitors (trench capacitors) and fin field-effect transistors (FinFETs), firstly trench capacitors are formed in a semiconductor substrate. The trench capacitors are in each case shaped in a manner oriented to hole trenches and arranged to form cell rows. The trench capacitors are arranged equidistantly with respect to one another within the cell rows. The trench capacitors are arranged in a manner offset with respect to one another in mutually adjacent cell rows. The offset (pitch) between the trench capacitors of two mutually adjacent cell rows preferably corresponds to half the distance between the trench capacitors within the cell row.

The semiconductor substrate is caused to recede between the cell rows, isolation trenches parallel to the cell rows being formed and semiconductor fins being formed from the semiconductor substrate between in each case two trench capacitors that are adjacent in the same cell row.

The isolation trenches are filled with an insulator material and trench insulator structures are formed in the process in the isolation trenches.

In the step which is essential to the invention, a mask having mask sections aligned with the hole trenches in each case is produced. At least one section of the adjoining trench insulator structure which adjoins the hole trench is covered by a respective mask section. By contrast, the sections of the trench insulator structures which adjoin the semiconductor fins remain uncovered.

The trench insulator structures are subsequently caused to recede in the sections not covered by the mask. In this case, gate trenches oriented to the semiconductor fins are formed within the trench insulator structures. The residual sections of the trench insulator structures that are oriented to the trench capacitors in each case form a trench-insulator structure which adjoins a respective trench capacitor.

Word lines orthogonal to the cell rows are subsequently formed, the gate trenches being filled by buried sections of the word lines. Relative to an individual FinFET, sidewall gate sections of the gate electrode of the relevant FinFET are formed by the buried sections of the word line on both sides of the semiconductor fin.

In an advantageous manner, the sidewall gate sections are accordingly insulated and decoupled by the trench-insulator structures from the adjoining trench capacitors formed in adjacent cell rows. In comparison with conventional methods, a trench-insulator structure whose thickness is independent of the formation of a gate dielectric between the word line and the semiconductor fin is provided between the trench capacitor and the sidewall gate section of the respective FinFET.

The word line is thus advantageously decoupled from the storage electrodes of the trench capacitors traversed by the word line.

In this embodiment, the mask sections preferably extend in each case additionally over the openings of the hole trenches.

In a further embodiment, the mask sections are provided such that they extend in each case on all sides and centrosymmetrically beyond the opening of the assigned hole trench.

Each of the two measures simplifies the production of a mask having mask sections aligned with the openings of the hole trenches.

A method in the course of which, prior to the introduction of the hole trenches or prior to the formation of the trench capacitors, a protective layer is applied to the semiconductor substrate is furthermore advantageous for the production of the mask. The formation of the trench capacitors is concluded with a filling of the hole trench with a conductive material, a storage electrode of the trench capacitor being formed by the filling of the hole trench. In the hole trenches, a top trench insulator is applied in each case on the storage electrode and the upper edge of the top trench insulator is in this case provided below the upper edge of the protective layer.

Between the upper edge of the top trench insulator and the upper edge of the protective layer, the hole trench is filled with a trench plug made of an auxiliary material.

The auxiliary material advantageously subsequently enables the formation of a mask having mask sections aligned with the openings of the hole trenches, the trench capacitors, which have already essentially been formed to completion, being protected against the subsequent processing by the top trench insulator and the underlying semiconductor substrate being protected by the protective layer.

Preferably, the isolation trenches are introduced after the hole trenches have been filled with the auxiliary material, and are filled with an insulator material and the trench insulator structures are formed in the process in the isolation trenches. The trench insulator structures run parallel to the cell rows and separate memory cells arranged in respectively adjacent cell rows from one another.

The trench insulator structures are subsequently caused to recede at least in sections along word-line lines running orthogonally to the cell rows.

In order to form a mask having mask sections aligned with a respective one of the hole trenches, according to a first embodiment of the method according to the invention, a mask material and a deposition process for the mask material are chosen such that the mask material grows selectively on the auxiliary material. In this case, the growth has an isotropic portion, so that the mask material, proceeding from the opening formed through the auxiliary material, grows both in a vertical direction with respect to the substrate surface and in a horizontal direction beyond the opening region.

The auxiliary material and the mask material are preferably identical. The auxiliary material is advantageously polysilicon.

According to a second embodiment of the method according to the invention, the auxiliary material is provided in doped fashion and, in order to form the mask having mask sections aligned with the hole trenches in each case, a mask auxiliary layer made of a second mask material is deposited over the whole area. A material whose etching resistance is dependent on the doping is chosen as second mask material. Afterward, an outdiffusion of the dopant from the doped auxiliary material is controlled and, in this case, the etching resistance of the second mask material is varied locally in the region of the opening of the hole trenches. Undoped sections of the mask auxiliary layer are removed selectively with respect to the doped sections. The sections of the mask auxiliary layer which are doped as a result of outdiffusion from the auxiliary material remain as residual mask sections which cover the opening of the hole trenches and sections of the protective layer and respectively of the trench insulator structure which adjoin the hole trenches, centrosymetrically with respect to the center point of the opening of the hole trenches. Sections of the trench insulator structures which adjoin the semiconductor fins are uncovered in this case.

The auxiliary material of the trench plugs is preferably polysilicon, which is deposited in a manner such that it is already doped or is deposited in undoped fashion and is subsequently doped. The second mask material is preferably undoped polysilicon, which can be etched selectively with respect to doped polysilicon in a comparatively simple manner.

The undoped polysilicon is preferably removed by means of a wet etching.

According to a third embodiment of the method according to the invention, the protective layer and the trench insulator structures are caused to recede in a common or in separate etching-back steps, so that the upper edge of the trench insulator structures is caused to recede with respect to the upper edge of the trench plugs and the upper edge of the protective layer is caused to recede at least as far as the upper edge of the trench insulator structures. Afterward, a third mask material is deposited conformally and etched back anisotropically to an extent such that residual sections of the third mask material form mask spacers which in each case annularly surround the freed section of a trench plug. Apart from the mask spacers, the third mask material is removed, so that the trench insulator structures are uncovered outside the sections covered by the mask spacers.

The mask spacers formed by the third mask material form mask sections of a mask, which are aligned with the hole trenches in each case, for a subsequent step of etching back the trench insulator structures.

The DRAM memory cell arrangement according to the invention comprises trench capacitors which are arranged regularly in cell rows in a semiconductor substrate and are in each case formed in a manner oriented to hole trenches. The trench capacitors of adjacent cell rows are arranged in a manner offset with respect to one another. Trench insulator structures are formed between the cell rows, semiconductor fins of FinFETs being formed between in each case two trench capacitors that are adjacent in the same cell row, in the semiconductor substrate. For each FinFET, in the semiconductor fin, in each case a first source/drain region, which is connected to a storage electrode of the respectively assigned trench capacitor, and a second source/drain region, which is connected to a data line, are formed as doped zones of a first conductivity type. The two source/drain regions are spaced apart from one another by a channel region that is undoped or doped by a second conductivity type opposite to the first conductivity type.

Overlying word lines orthogonal to the cell rows mesh with buried sections in comblike fashion between the cell rows. A pair of buried sections of the word lines in each case forms, along a semiconductor fin, sidewall gate sections of the FinFET assigned to the semiconductor fin. At the vertical sidewall that is respectively remote from the semiconductor fin, the sidewall gate sections adjoin a trench capacitor formed in the adjacent cell row.

According to the invention, trench-insulator structures are provided in each case between the sidewall gate sections and the adjoining trench capacitors. The trench-insulator structures surround the respectively assigned hole trench in a section above the trench insulator structure with uniform layer thickness.

Preferably, the trench-insulator structures are formed from the material of the trench insulator structures and emerge from a precursor of the trench insulator structure.

The trench-insulator structures advantageously have a larger layer thickness than a gate dielectric provided between the semiconductor fin and the gate electrode or word line.

Figure 2:
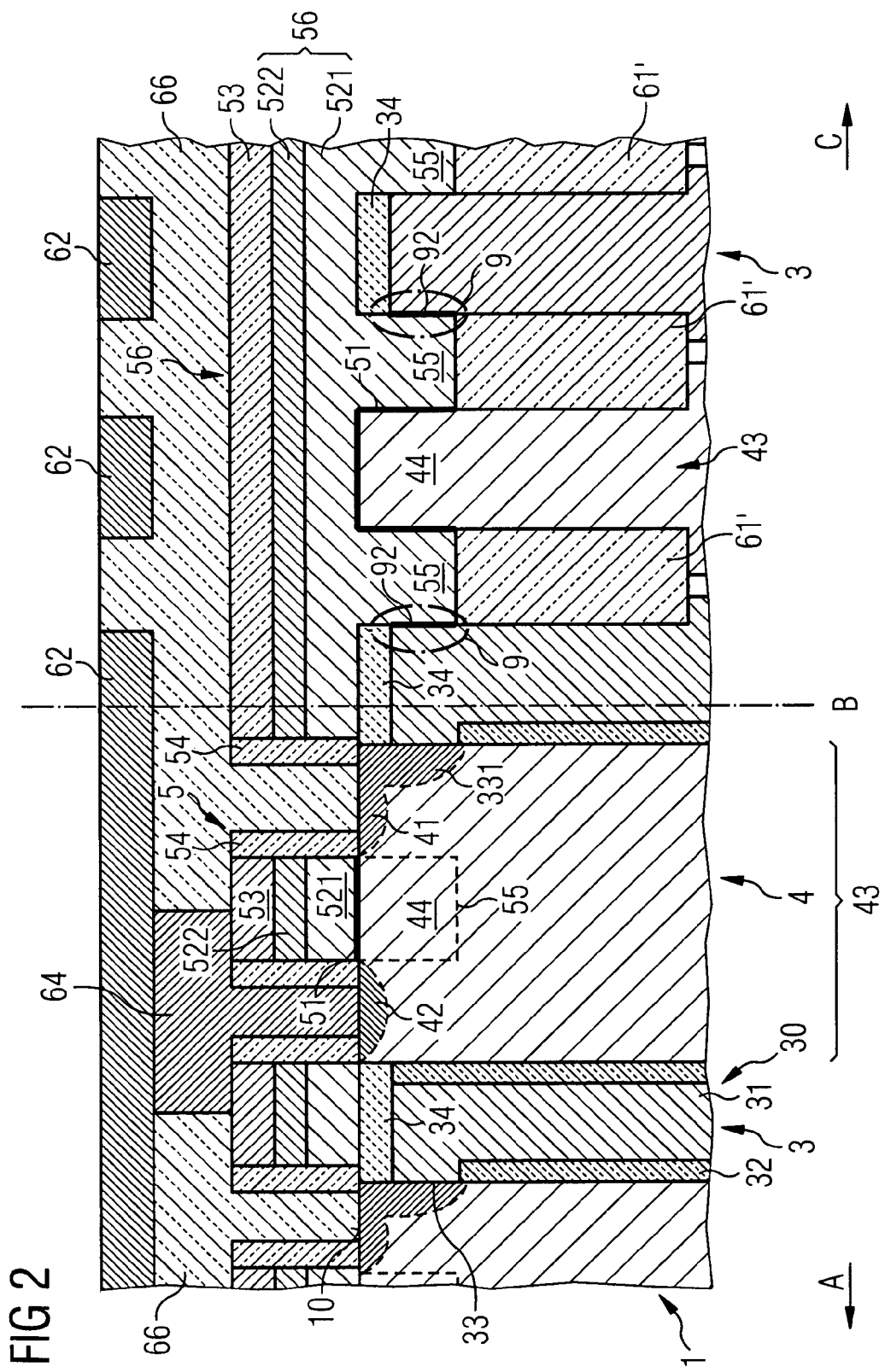
FIG. 2 illustrates one exemplary embodiment of a combined longitudinal/cross section through a memory cell array having trench capacitors and fin field-effect transistors.

FIG. 2 illustrates one embodiment of a memory cell arrangement in a combined longitudinal/cross section relative to the cell rows, such as might result for memory cells having trench capacitors according to the Park et al. document cited in the introduction.

Trench capacitors 3 are formed in a semiconductor substrate 1, said trench capacitors being shaped in a manner oriented to hole trenches 30 which are introduced into the semiconductor substrate 1 from a substrate surface 10. Outside the region illustrated, outer electrodes of the trench capacitors 3 are formed in each case as a doped zone in sections of the semiconductor substrate 1 which surround a lower section of the hole trenches 30. A storage electrode 31 of the trench capacitor 3 is in each case arranged in the interior of the hole trench 30 and is insulated from the outer electrode by a capacitor dielectric outside the region illustrated. In an upper section of the hole trench 30 between the substrate surface 10 and the lower section, the storage electrode 31 is insulated from the semiconductor substrate 1 surrounding the upper section of the hole trench 30 by a collar insulator 32 formed along the inner wall of the hole trench 30. The storage electrode 31 is terminated by a top trench insulator 34 and insulated from structures bearing on the substrate surface 10.

Along the cell row, a fin field-effect transistor 4 assigned to the trench capacitor 3 in each case adjoins the trench capacitor 3. The fin field-effect transistor 4 is formed along a semiconductor fin 43. For the illustrated exemplary embodiment of a checkerboard layout, the semiconductor fin 43 is formed along the cell row between in each case two trench capacitors 3 that are adjacent within the same cell row.

One of the semiconductor fins 43 is illustrated in longitudinal section in the section A/B of the sectional drawing and another fin is illustrated in cross section in the section B/C.

A first source/drain region 41 is formed in the semiconductor fin 43 in a manner adjoining the substrate surface 10, said first source/drain region adjoining the storage electrode 31 of the respectively assigned trench capacitor 3 via a buried strap outdiffusion 331 in the region of a contact window 33. In the region of the contact window 33, the collar insulator structure 32 is caused to recede on one side in a manner oriented toward the assigned semiconductor fin 43.

Furthermore, in the semiconductor fin 43, a second source/drain region of the fin field-effect transistor 4 is formed as a doped zone adjoining the substrate surface 10.

The second source/drain region 42 is connected to a bit or data line 62 via a bit line contact 64. The data lines 62 run in striplike fashion in the direction of the cell rows.

Word lines 56 are formed transversely with respect to the cell rows or the bit lines 62. The word lines 56 have a striplike structure above the substrate surface 10 and form a gate stack structure 5 relative to an individual FinFET. The gate stack structure 5 in each case comprises a polysilicon section 521, which bears on the substrate surface 10 and is spaced apart from the semiconductor substrate 1 by a gate dielectric 51, and also a highly conductive section 522 bearing on the polysilicon section 521. The gate stack structure 5 is terminated by a gate cap 53 made of a dielectric material which bears on the highly conductive section 522. The gate stack structures 5 formed in striplike fashion are enclosed along the sidewalls by gate spacers 54 made of a dielectric material. The gate stack structures 5 are insulated from one another and from the bit lines 62 by an interlayer dielectric 66.

The section B/C of the sectional drawing transversely with respect to the cell row reveals that respectively adjacent cell rows are insulated from one another by trench insulator structures 61'. The trench insulator structures 61' are caused to recede in a manner corresponding to the overlying word line 56 in an upper section, so that the polysilicon section 521 of the word line 56 alternately meshes between the semiconductor fins 43 and the trench capacitors 3 in comblike fashion from above. Relative to an individual memory cell, the word line 56 forms in sections gate electrodes of a FinFET controlled by the word line 56.

The buried sections of the gate electrode 52 that have emerged from the trench insulator structures 61' having been caused to recede on both sides of a semiconductor fin 43 define sidewall gate sections 55. The sidewall gate sections 55 are formed in accordance with the dashed line in the section a/b along the cell row below the gate stack structures 5 or word lines 56. A channel region 44 which spaces the two source/drain regions 41, 42 of a fin field-effect transistor 4 apart from one another is accordingly enclosed by the gate electrode 52 on three sides.

It can be seen from the section B/C of the sectional drawing along the word line 56 that the buried gate sections 55 in each case adjoin, on the one hand, the semiconductor fin 43 and, on the other hand, on the side remote from the semiconductor fin 43, the storage electrode 31 of a trench capacitor 3 formed in the adjacent cell row.

In the region of the semiconductor fin 43, a gate dielectric 51 is provided between the semiconductor substrate 1 and the word line 56. The process conditions for producing the gate dielectric 51 also determine the formation of an insulator structure which separates the storage electrode 31 from the traversing word line 56 in the region of a boundary zone 9. The properties of the insulator structure between the storage electrode 31 and the word line 56 are linked with the properties of the gate dielectric 51. As a consequence thereof, parasitic coupling capacitances between the word line 56 and the storage electrodes 31 arranged along the word line 56 are increased or the properties of the gate dielectric are inadequate.

In a manner corresponding to the section A/B/C of FIG. 1a, a first exemplary embodiment of the method according to the invention is illustrated in a plurality of steps on the basis of sectional drawings in FIGS. 3A-3E.

A protective layer 7 is applied to a substrate surface 10 of a semiconductor substrate 1. The protective layer 7 typically comprises a silicon nitride layer (pad nitride). The protective layer 7 can also be realized as a layer stack made of different materials. By way of example, a stress compensating layer for compensating for thermomechanical stresses between the semiconductor substrate 1 and the silicon nitride layer is provided between the semiconductor substrate 1 and the silicon nitride layer.

Through the protective layer 7, hole trenches 30 are introduced into the underlying semiconductor substrate 1 and trench capacitors 3 are formed in a manner oriented to the hole trenches 30. The illustration of the trench capacitors 3 is limited in each case to an upper section in which a collar insulator structure 32 is provided in each case along the inner wall of the hole trench 30. The collar insulator structure 32 is caused to recede on one side within a section oriented to the cell row. The hole trench 30 is filled with a conductive material which forms a storage electrode 31 of the trench capacitor 3. In the openings of the hole trenches 30, a top trench insulator 34 with an upper edge below the upper edge of the protective layer 7 is in each case provided on the storage electrodes 31.

Polysilicon is subsequently deposited, the hole trenches 30 being filled above the top trench insulator 34 at least as far as the upper edge of the protective layer 7. Polysilicon that has been deposited above the upper edge of the protective layer 7 is removed.

Isolation trenches are introduced between the cell rows and trench insulator structures 61' are formed by filling the isolation trenches with an insulator material. The subsequently formed memory cells of adjacent cell rows are electrically insulated and decoupled from one another by the trench insulator structures 61'. The insulator material is planarized to produce a planar process surface which is formed in sections from the material of the protective layer 7, the polysilicon filling the hole trenches 30, and the insulator material of the trench insulator structures 61.

Figure 3A:
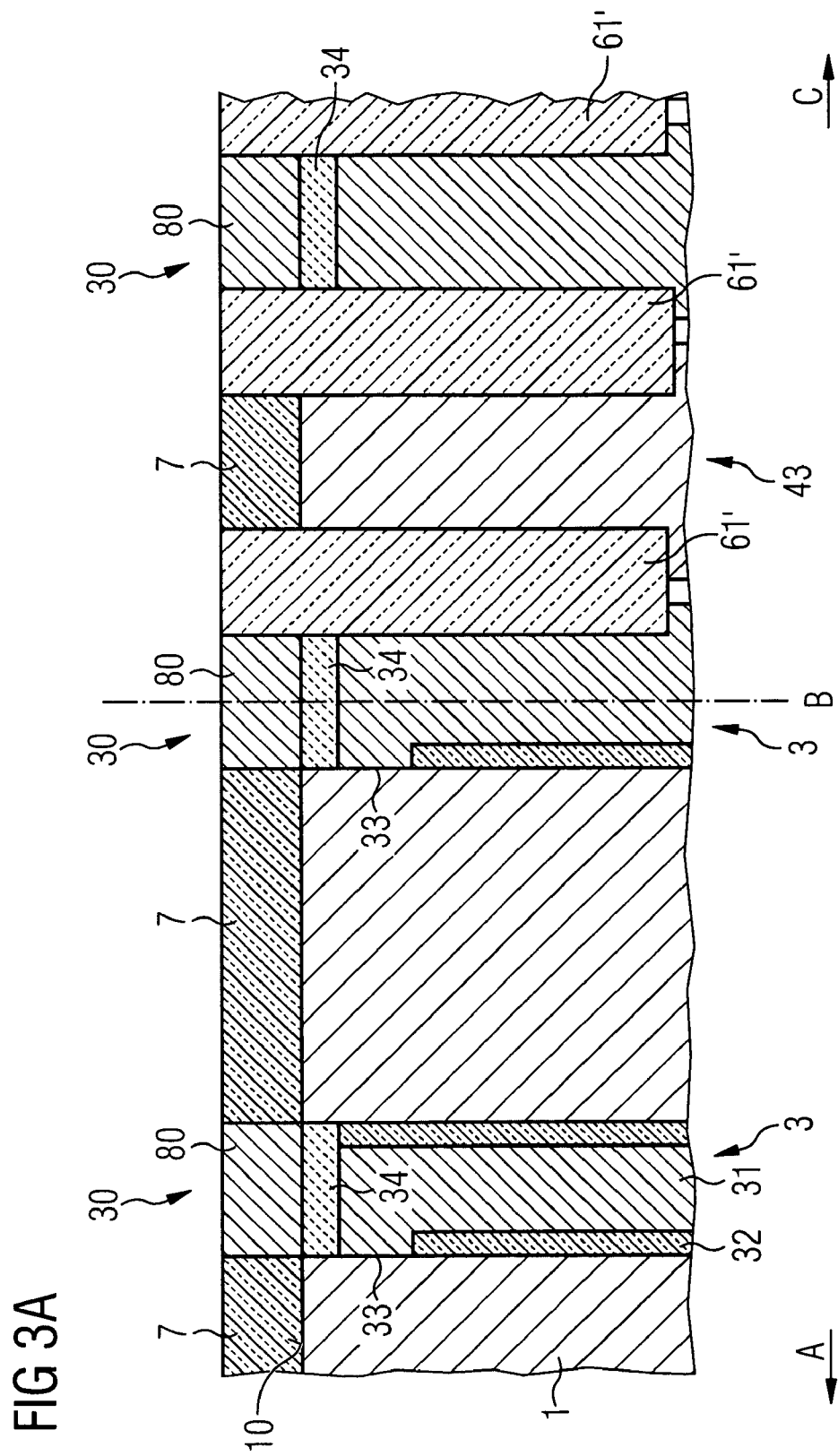

The structure produced in this way is illustrated in FIG. 3A. The protective layer 7 bears on the substrate surface 10 of the semiconductor substrate 1. Trench capacitors 3 are formed in the semiconductor substrate 1. The storage electrode 31 of a trench capacitor 3 adjoins the surrounding semiconductor substrate 1 on one side in each case in the region of a contact window 33 and is otherwise insulated from the semiconductor substrate 1 by a collar insulator 32 in the upper section of the semiconductor substrate 1 illustrated. A top trench insulator 34 bears on the storage electrode 31 within the hole trench 30. Above the upper edge of the top trench insulator 34, the hole trenches 30 are in each case filled with polysilicon as far as the upper edge of the protective layer 7. The polysilicon in each case forms a trench plug 80 in the hole trenches 30. Adjacent cell rows are separated from one another by trench insulator structures 61'.

Proceeding further, polysilicon is deposited under process conditions under which polysilicon grows at a high rate on polysilicon and does not grow, or grows at a significantly lower rate, on the material of the protective layer or the material of the trench insulator structure 61.

If the polysilicon does not grow exclusively on the trench plugs, but rather, at a lower rate, also on the material of the trench insulator structure 61', then the polysilicon is caused to recede uniformly in an intermediate step until the polysilicon is completely removed from above sections of the trench insulator structures 61' that adjoin the semiconductor fins, and in the process is simultaneously preserved above the openings of the hole trenches 30 and in sections adjoining the openings in each case as mask section 8' of a mask.

Figure 3B:
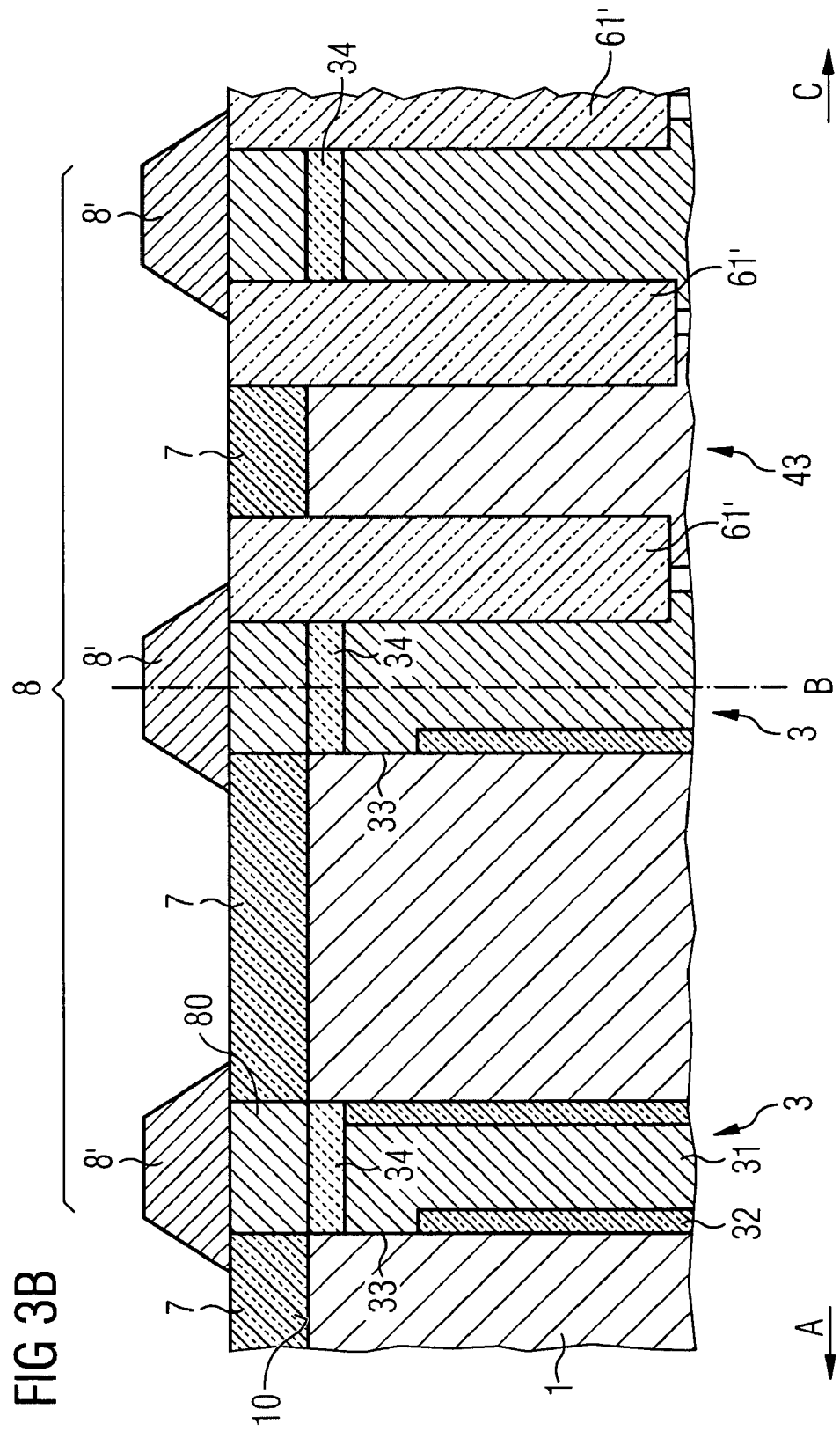

The mask 8 having the mask sections 8' which is produced in this way is illustrated in FIG. 3B. A mask section 8' bears on each of the trench plugs 80, which mask section covers the opening of the respectively assigned hole trench capacitor 30 and extends beyond the opening of the hole trench 30 approximately centrosymetrically over adjoining sections of the trench insulator structures 61' or of the protective layer 7. The trench insulator structure 61' is uncovered on that side of the trench insulator structure 61' which is respectively opposite to the hole trench 30.

The trench insulator structure 61' is caused to recede selectively with respect to the polysilicon of the mask sections 8' and the material of the protective layer 7. The etching-back depth determines the channel width of the FinFETs that are subsequently to be formed.

Figure 3C:
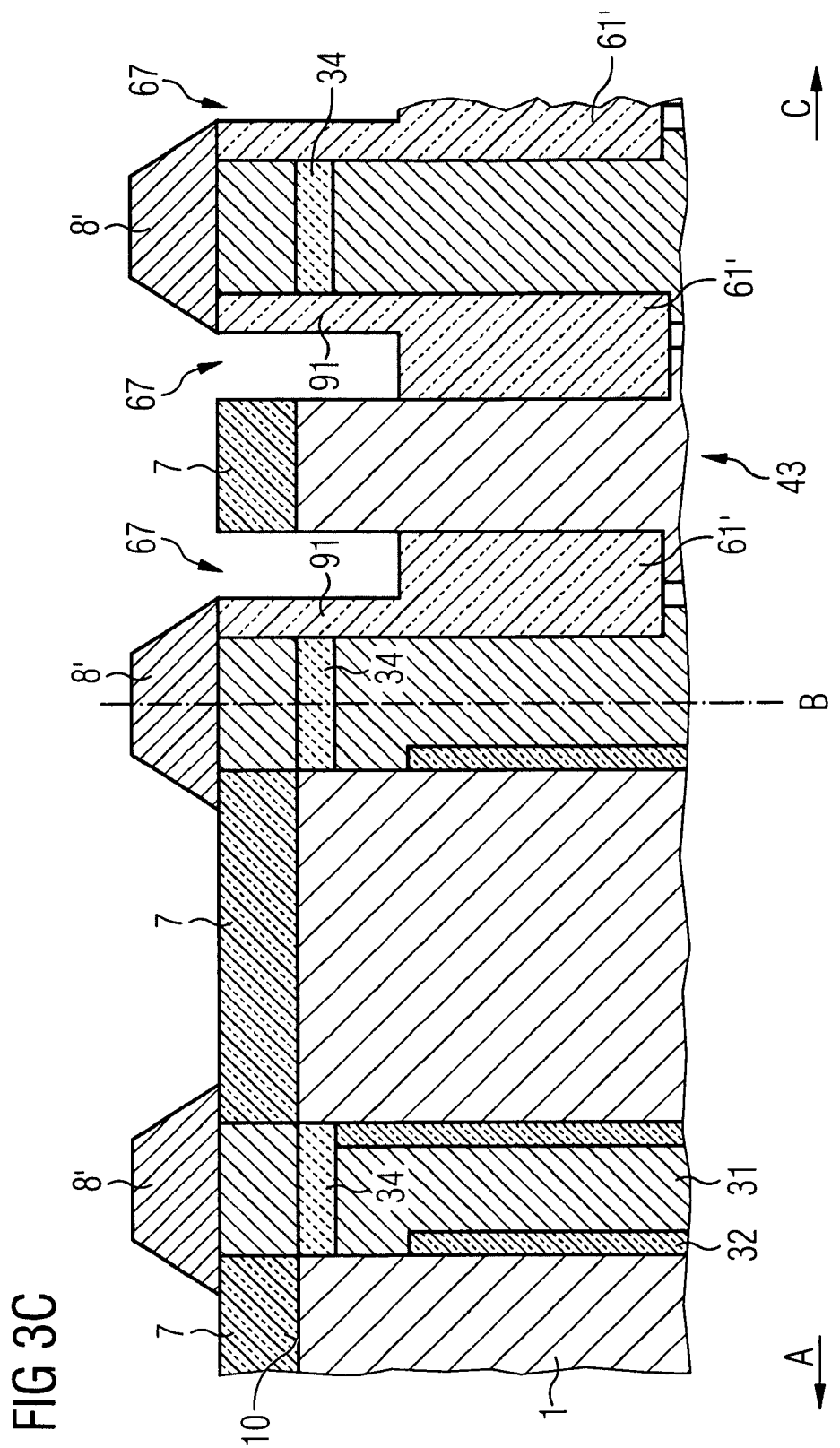

The result of etching back the trench insulator structures 61' is illustrated in FIG. 3C. The etching-back in each case defines a semiconductor fin 43 of the FinFET to be formed. The etching-back is locally suppressed around the trench capacitors 3. Comparatively thick trench-insulator structures 91 made of the insulator material of the trench insulator structures 61' remain between the gate trenches 67 created by the etching-back and the trench capacitors 3.

The vertical sections of the semiconductor fin 43 that are uncovered by the etching-back are temporarily protected against the subsequent processing by an oxidic sacrificial layer (sacrificial sidewall oxidation). The mask sections 8' and also the trench plugs 80 and the protective layer 7 are removed for instance by ion beam etching (reactive ion etching, RIE).

The result is the structure illustrated in FIG. 3D, in the case of which the protective layer 7, the trench plugs 80 and the mask sections 8' have been removed in comparison with FIG. 3C.

A gate dielectric 51 is provided on the horizontal and vertical sidewalls of the semiconductor fin 43. Polysilicon and a layer made of a highly conductive material and also the material of the gate cap 53 are successively applied and patterned in striplike fashion. Gate spacers 54 are formed on the sidewalls of the striplike structures. By doping the semiconductor substrate 1 in the region of the semiconductor fin 43, in each case first source/drain regions 41 adjoining the storage electrode 31 of the respectively assigned trench capacitor 3 and second source/drain regions 42 spaced apart from the first source/drain regions 41 by a respective channel region 44 covered by a word line 56 are formed as doped zones in the semiconductor substrate 1.

Figure 3E:
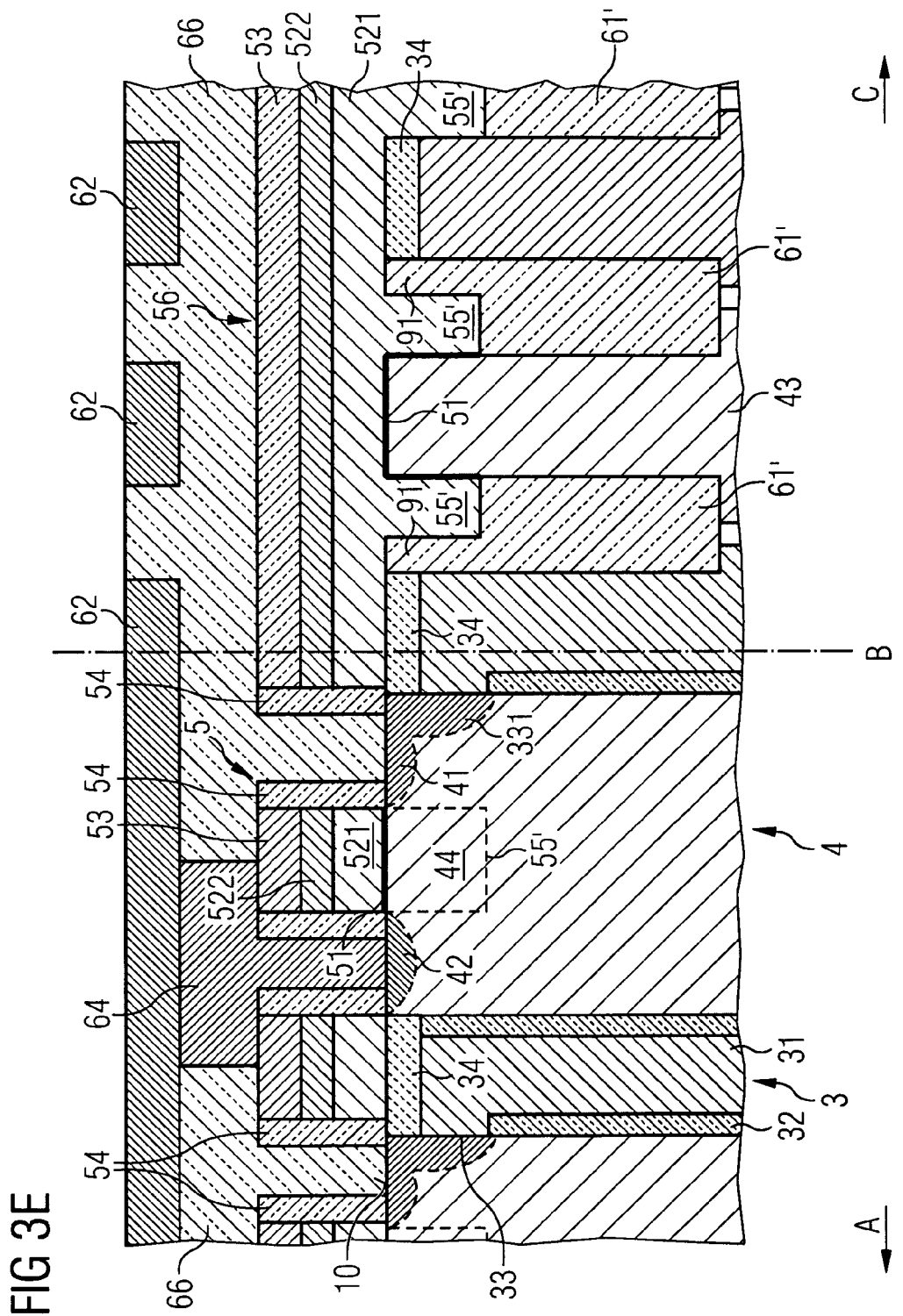

The result is the structure illustrated in FIG. 3E, which differs from that illustrated in FIG. 2 by virtue of the trench-insulator structures 91. Given a round or elliptical cross section of the hole trenches 30, the trench-insulator structures 91 adjoin the latter as sections of a circular or elliptical ring.

The exemplary embodiment of the method according to the invention which is illustrated with reference to the drawings of FIG. 4A-4C follows FIG. 3A, the polysilicon with which the hole trenches 30 are filled above the top trench insulator 34 either being deposited such that it is already doped or being deposited in undoped fashion and being doped subsequently.

After a planarization step, a mask auxiliary layer 82 made of undoped polysilicon is deposited over the whole area.

Figure 4A:
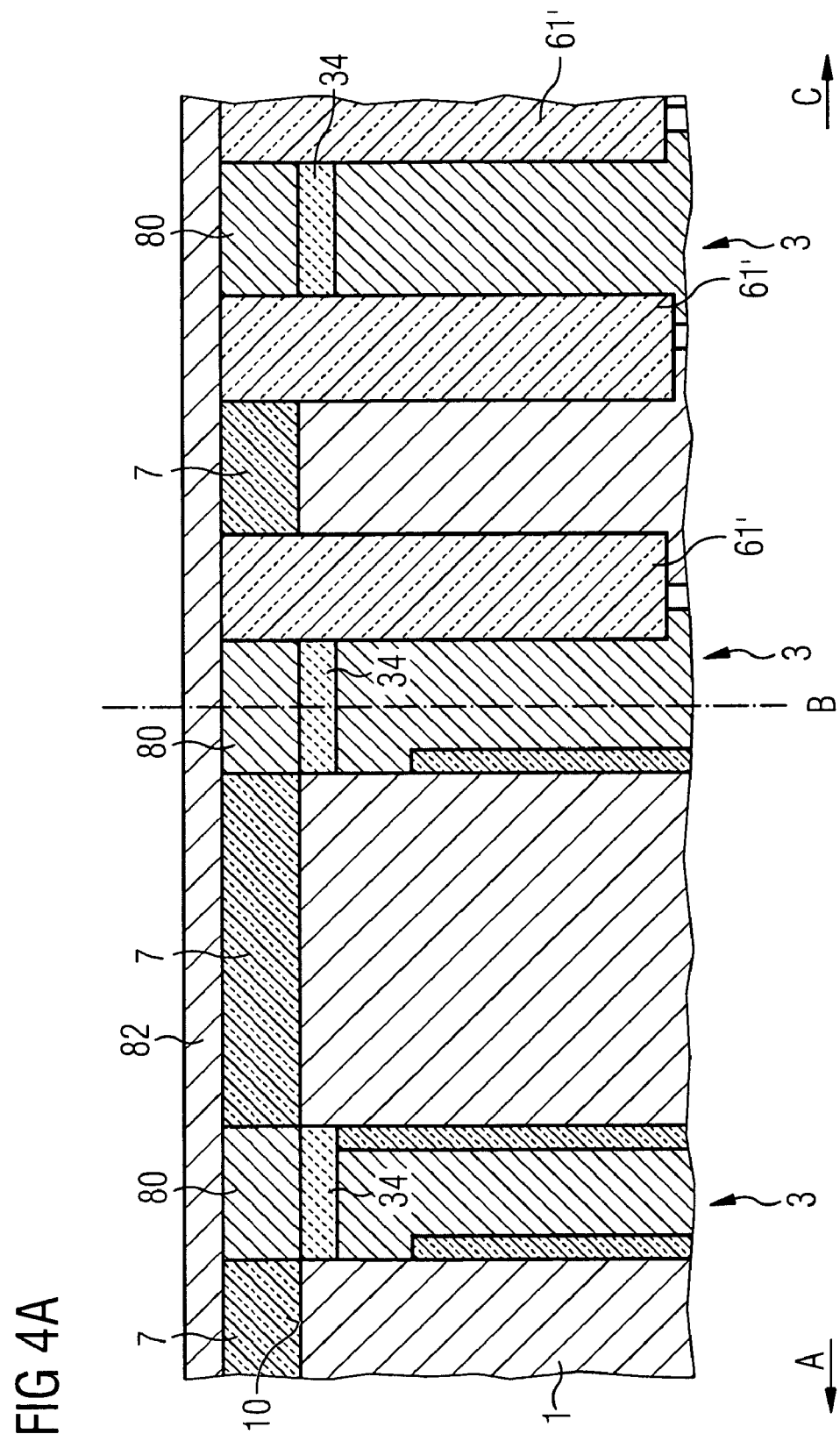

FIG. 4A illustrates the trench plugs 80 formed by doped polysilicon and also the mask auxiliary layer 82 bearing on a process surface formed in sections from the protective layer 7, the trench plugs 80 and the trench insulator structures 61'.

An outdiffusion of the dopant from the trench plugs 80 into the overlying mask auxiliary layer 82 is controlled in a thermal step.

As illustrated in FIG. 4B, the indiffusion of the dopant from the trench plugs 80 into the sections of the mask auxiliary layer 82 that adjoin the trench plugs 80 has given rise to doped sections 83 within the mask auxiliary layer 82' in the region of the openings of the hole trenches 30. A modified mask auxiliary layer 82', the etching resistance of which is modified in sections, has emerged from the original mask auxiliary layer 82.

By means of a subsequent wet etching step, the undoped section of the modified mask auxiliary layer 82' is removed selectively with respect to the doped sections 83.

Figure 4C:
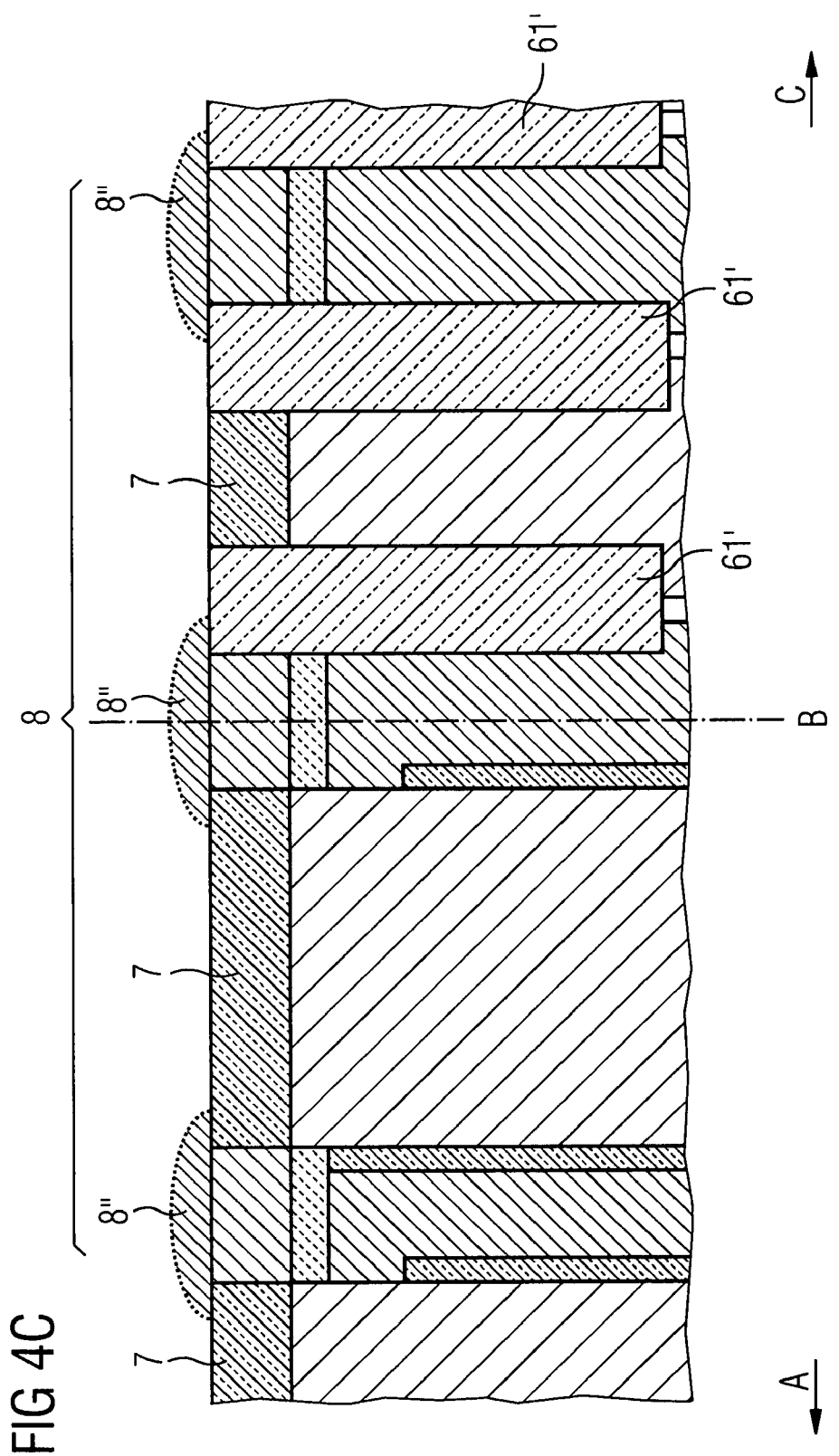

The result is a mask having the mask sections 8'' illustrated in FIG. 4C. The further processing is affected in accordance with the illustration in FIGS. 3c to 3e.

Figure 5A:
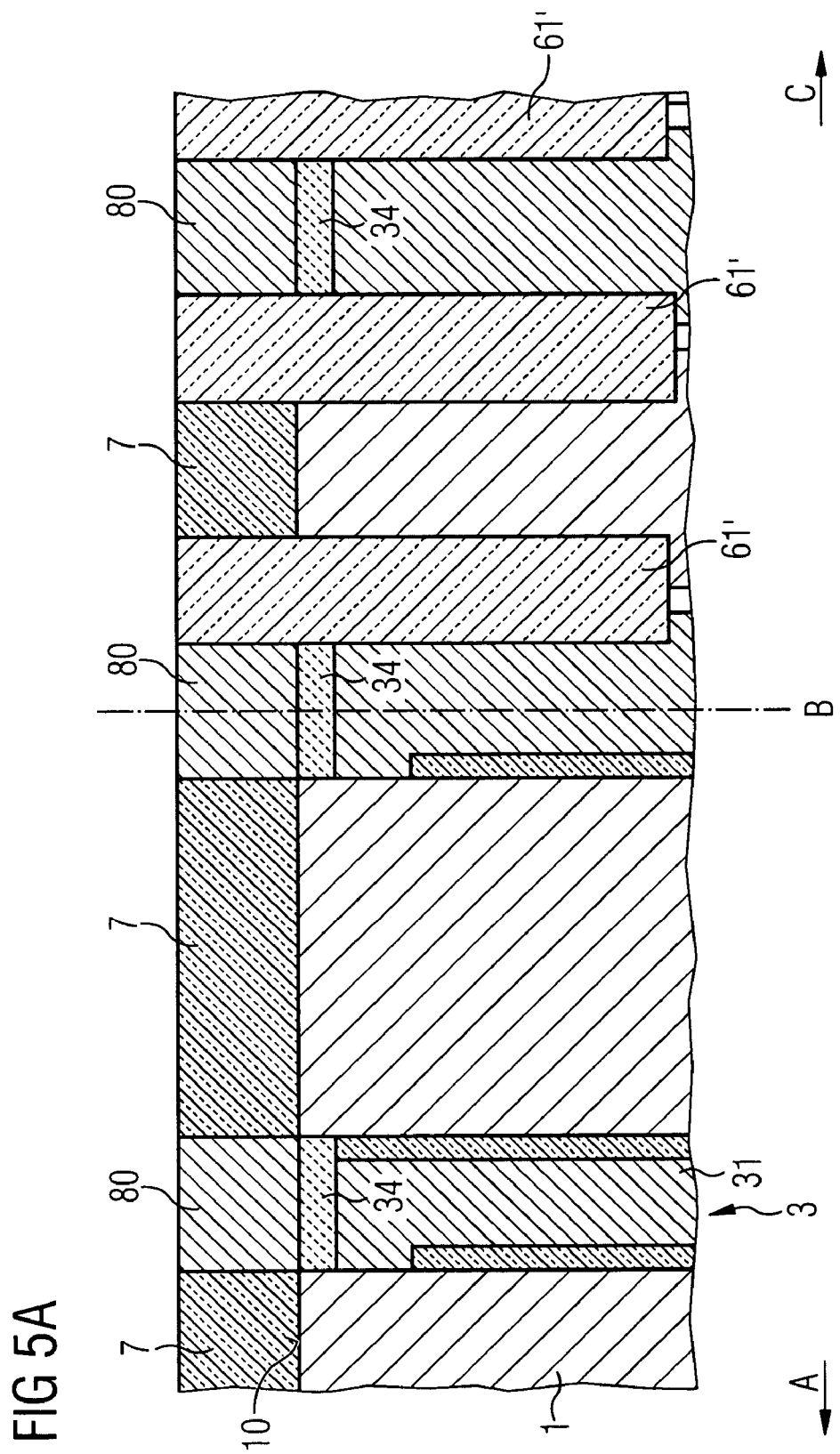
FIGS. 5A-5B illustrate combined longitudinal/cross sections through a memory cell array having trench capacitors and fin field-effect transistors in two different phases of a third exemplary embodiment of the method according to the invention with formation of mask spacers from a mask auxiliary layer.
Figure 5B:
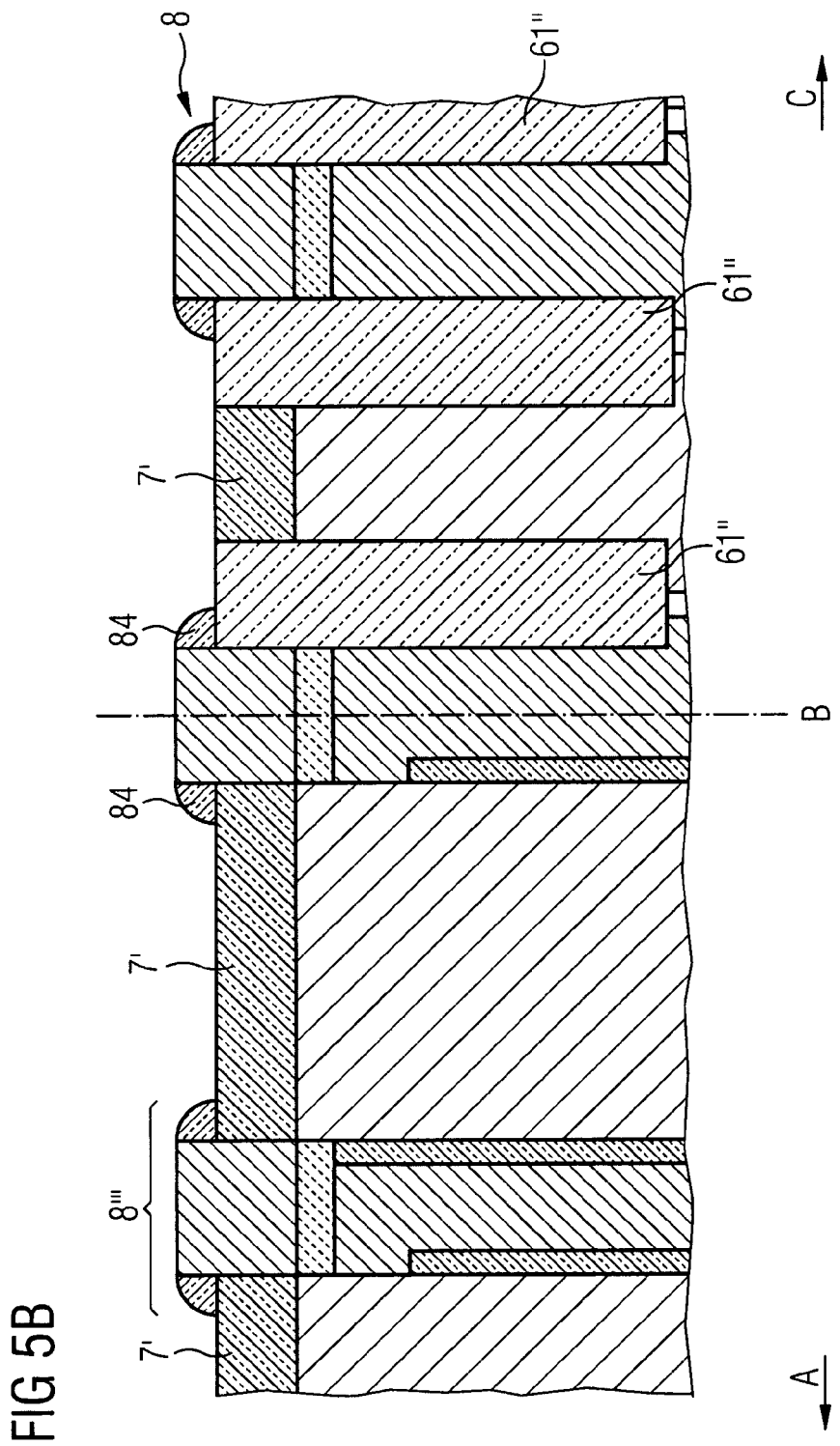

Like the two previous exemplary embodiments, the third exemplary embodiment of the method according to the invention in accordance with FIG. 5 is also based on a structure in accordance with FIG. 3A. In contrast to the structure of FIG. 3A, the protective layer 7 is provided with a larger layer thickness in the structure in accordance with FIG. 5A.

In order to form a mask having mask sections 8''' aligned with the trench capacitors 3, both the protective layer 7 and the trench insulator structures 61' are caused to recede. In this case, the layer thickness of the protective layer 7 is reduced. The original layer thickness of the protective layer 7 is chosen such that its functionality is preserved in the subsequent processing with the reduced layer thickness.

The protective layer 7 and also the trench insulator structures 61' are etched back in such a way that the upper edge of the trench insulator structures 61' is caused to recede to below the upper edge of the trench plugs 80. The protective layer 7 is caused to recede as far as the upper edge of the trench insulator structures 61" that have been caused to recede or below said upper edge. Polysilicon or amorphous silicon is deposited conformly as mask material and caused to recede by means of an etching-back step with a high anisotropic portion. In this case, the mask material is removed from horizontal sections of the surface of the protective layer 7' that has been caused to recede and also from sections of the trench insulator structures 61" that adjoin the semiconductor fins 43. Residual sections of the mask material form mask spacers 84 along the vertical sidewalls of the uncovered upper sections of the trench plugs 80. The mask spacers 84 in each case surround the trench plugs 80 in the uncovered upper section and cover the section of the trench insulator structure 61" that adjoins the trench capacitor 3. The mask spacers 84, together with the trench plugs 80 form mask sections 8''' of a mask 8.

The further processing is effected in accordance with FIGS. 3C to 3E.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an integrated circuit, the method comprising:
    forming trench capacitors arranged in cell rows and oriented in each case to hole trenches in a semiconductor substrate;
    introducing trench insulator structures between the cell rows, wherein semiconductor fins of fin field-effect transistors are formed from the semiconductor substrate between in each case two trench capacitors that are adjacent in a cell row;
    providing a mask comprising mask sections, wherein each mask section is aligned to one of the hole trenches, such that first trench insulator structures sections which adjoin the hole trenches are covered by the mask sections and second trench insulator structures sections which adjoin central portions of the semiconductor fins are not covered by the mask sections;
    introducing gate trenches into the trench insulator structures using the mask to form second insulator structures, wherein each second insulator structure emerges from one of the first insulator structure sections.

2. The method of claim 1, wherein each mask section extends over an opening of a respective one of the hole trenches.

3. The method of claim 1, wherein
    each mask section extends on all sides beyond an opening of a respective one of the hole trenches.

4. The method of claim 3, further comprising prior to the formation of the trench capacitors:
    applying a protective layer to the semiconductor substrate;
    providing in each hole trench a storage electrode and providing a top trench insulator with an upper edge below an upper edge of the protective layer on each storage electrode; and
    introducing a trench plug made of an auxiliary material into each hole trench between the upper edge of the protective layer and an upper edge of the top trench insulator.

5. The method of claim 4, wherein providing the mask comprises:
    selecting a first mask material that is capable of growing selectively on the auxiliary material and
    controlling a deposition of the first mask material such that the first mask material grows with an isotropic portion on the trench plugs to form the mask sections from the first mask material.

6. The method of claim 5, wherein the auxiliary material is the same as the first mask material.

7. The method of claim 6, wherein polysilicon is provided as the first mask material.

8. A method for fabricating an integrated circuit, comprising:
    forming trench capacitors arranged in cell rows and oriented in each case to hole trenches in a semiconductor substrate, the trench capacitors of adjacent cell rows being provided in a manner offset with respect to one another;
    introducing trench insulator structures between the cell rows, and forming semiconductor fins of fin field-effect transistors from the semiconductor substrate between in each case two trench capacitors that are adjacent in a cell row;
    providing a mask having mask sections, wherein each mask section is aligned to one of the hole trenches, such that first trench insulator structures which adjoins the hole trenches are covered by the mask sections and second trench insulator structure sections which adjoin central portions of the semiconductor fins are not covered by the mask sections;
    introducing gate trenches into the trench insulator structures using the mask to form second insulator structures, wherein each second insulator structure emerges from one of the first trench insulator structure sections; and
    applying word lines orthogonal to the cell rows with buried sidewall gate sections introduced into the gate trenches, wherein the buried sidewall gate sections are separated from the respectively adjoining trench capacitor by a respective one of the second insulator structures.

9. The method of claim 8, wherein each mask section extends over an opening of a respective one of the hole trenches.

10. The method of claim 8, wherein each mask section extends on all sides beyond an opening of a respective one of the hole trenches.

11. The method of claim 8, further comprising:
prior to the formation of the trench capacitors, applying a protective layer to the semiconductor substrate;
in the course of forming the trench capacitors, providing in the hole trenches, a storage electrode and a top trench insulator with an upper edge below an upper edge of the protective layer on the storage electrode; and
introducing a trench plug made of an auxiliary material into the hole trenches in each case between the upper edge of the protective layer and an upper edge of the top trench insulator.

12. The method of claim 11, wherein providing the mask comprises
selecting a first mask material and the auxiliary material such that the first mask material grows selectively on the auxiliary material and
controlling a deposition of the first mask material such that the mask material grows with isotropic portions on the trench plugs to form the mask sections aligned with the trench capacitors.

13. The method of claim 12, wherein
the auxiliary material is the same as the first mask material.

14. The method of claim 12, wherein polysilicon is provided as the first mask material.

15. The method of claim 11, wherein providing the mask comprises:
providing the auxiliary material in a manner doped with a dopant;
applying a mask auxiliary layer made of a second mask material, the etching resistance of which can be varied by the dopant, on the semiconductor substrate;
controlling an outdiffusion of the dopant from the doped auxiliary material to form doped sections of the mask auxiliary layer which adjoin the trench plugs.

16. The method of claim 15, further comprising
etching back non-doped sections of the mask auxiliary layer selectively with respect to the doped sections to form the mask selections from the doped sections of the mask auxiliary layer.

17. The method of claim 15, wherein the second mask material is undoped silicon.

18. The method of claim 15, wherein
the auxiliary material is doped polysilicon.

19. The method of claim 11, wherein providing the mask comprises:
causing the trench insulator structures to recede to below the upper edge of the trench plugs;
depositing a third mask material conformally; and
anisotropically etching back the third mask material to form the mask sections from the third mask material.

20. The method of claim 19, wherein
the third mask material is silicon nitride.

21. The method of claim 19, wherein
the third mask material is silicon nitride.

* * * * *